United States Patent
Chen et al.

(10) Patent No.: US 7,541,925 B2
(45) Date of Patent: Jun. 2, 2009

(54) MAPPING SYSTEM AND METHOD FOR DETERMINING OPTIMAL RADIO TRANSPONDER PLACEMENT

(75) Inventors: Han Chen, White Plains, NY (US); Young Hoon Kwark, Chappaqua, NY (US); John Douglas Martin, II, San Jose, CA (US); Paul A. Moskowitz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 580 days.

(21) Appl. No.: 11/257,408

(22) Filed: Oct. 24, 2005

(65) Prior Publication Data
US 2007/0093983 A1  Apr. 26, 2007

(51) Int. Cl.
  *G08B 13/14* (2006.01)
(52) U.S. Cl. ............................ 340/572.1; 340/10.1
(58) Field of Classification Search ...... 340/572.1–572.6, 340/10.1; 239/429; 235/375, 435, 450
See application file for complete search history.

(56) References Cited

U.S. PATENT DOCUMENTS

| 6,054,848 | A | 4/2000 | Torres et al. | |
|---|---|---|---|---|
| 6,317,027 | B1 | 11/2001 | Watkins | |
| 2002/0067267 | A1 | 6/2002 | Kirkham | |
| 2002/0196126 | A1 | 12/2002 | Eisenberg et al. | |
| 2003/0227385 | A1* | 12/2003 | Lancaster | 340/572.1 |
| 2004/0041707 | A1* | 3/2004 | Hull et al. | 340/568.1 |
| 2004/0113791 | A1 | 6/2004 | Salim et al. | |
| 2005/0108044 | A1 | 5/2005 | Koster | |

FOREIGN PATENT DOCUMENTS

| DE | 19629024 A1 | 1/1998 |
|---|---|---|
| DE | 19705287 A1 | 9/1998 |
| FR | 2787583 A1 | 6/2000 |

OTHER PUBLICATIONS

Norgard, J.D., "Electromagnetic Magnitude and Phase Measurements for Infrared Thermograms", Aerospace Conference, 1997, IEEE, vol. 2, Feb. 1, 1997, pp. 145-157.
Johnson, M., "RF Mapping for Packaging - Finding that 'Sweet Spot'", Aug. 29, 2005, URL: http://www.rfidtribe.com/news-05-08-29.html.
Norgard, J.D., "Infrared/Microwave Correlation Measurements", Optical Engineering, Soc. of Photo-Optical Instrumentation Engineers, Bellingham, US vol. 33, No. 1, jan. 1994, pp. 85-96a.

* cited by examiner

*Primary Examiner*—George A Bugg
*Assistant Examiner*—Shirley Lu
(74) *Attorney, Agent, or Firm*—Schmeiser, Olsen & Watts; William E. Schiesser (57) ABSTRACT

A mapping system and method. The mapping system comprises an electromagnetic field generator, a layer of electromagnetic field absorbing material over an object, and an infrared camera. The electromagnetic field generator is adapted to generate an electromagnetic field and expose the electromagnetic field absorbing material and object to the electromagnetic field. The layer of electromagnetic field absorbing material is adapted to absorb the electromagnetic field and generate areas of thermal differences within the electromagnetic field absorbing material. The infrared camera is adapted to detect the areas of thermal differences.

26 Claims, 5 Drawing Sheets

MAPPING SYSTEM AND METHOD FOR DETERMINING OPTIMAL RADIO TRANSPONDER PLACEMENT

TECHNICAL FIELD

The present invention relates to a mapping system and associated method for determining optimal radio transponder placement on an object.

BACKGROUND OF THE INVENTION

Selecting a suitable area for placement of a communication device on a product so that the product may be located typically requires a complicated and tedious series of steps. Therefore there exists a need for an efficient means for selecting a suitable area for placement of a communication device on a product.

SUMMARY OF THE INVENTION

The present invention provides a mapping system, comprising:
an electromagnetic field generator; and
a layer of electromagnetic field absorbing material over an object, wherein said electromagnetic field generator is adapted to generate an electromagnetic field and expose said electromagnetic field absorbing material and said object to said electromagnetic field, and wherein said layer of electromagnetic field absorbing material is for absorbing said electromagnetic field and generating areas of thermal differences within said electromagnetic field absorbing material; and
an infrared camera for detecting said areas of thermal differences.

The present invention provides a mapping system, comprising:
an electromagnetic field generator;
a layer of electromagnetic field absorbing material over an object;
a layer of thermal indicating material over said layer of electromagnetic field absorbing material, wherein said electromagnetic field generator is adapted to generate an electromagnetic field and expose said layer of thermal indicating material, said layer of electromagnetic field absorbing material, and said object to said electromagnetic field, wherein said layer of electromagnetic field absorbing material is adapted to absorb said electromagnetic field and generate areas of thermal differences within said electromagnetic field absorbing material, and wherein said layer of thermal indicating material is adapted to generate a thermal map illustrating each of said areas of thermal differences; and
a camera adapted to record said thermal map.

The present invention provides a mapping method, comprising:
providing-an electromagnetic field generator, a layer of electromagnetic field absorbing material over an object, and an infrared camera;
exposing by said electromagnetic field generator, said layer of electromagnetic field absorbing material and said object to said electromagnetic field;
generating in response to said exposing, areas of thermal differences within said layer of electromagnetic field absorbing material; and
detecting by said infrared camera, said areas of thermal differences.

The present invention provides a mapping method, comprising:
providing an electromagnetic field generator, a layer of electromagnetic field absorbing material over an object, a layer of thermal indicating material over said layer of electromagnetic field absorbing material, and a camera;
exposing by said electromagnetic field generator, said layer of thermal indicating material, said layer of electromagnetic field absorbing material, and said object to said electromagnetic field;
generating in response to said exposing, areas of thermal differences within said layer of electromagnetic field absorbing material;
generating by said of layer of thermal indicating material, a thermal map illustrating each of said areas of thermal differences; and
recording by said camera, said thermal map.

The present invention provides a process for deploying computing infrastructure, said process comprising integrating computer-readable code into a computing system, wherein the code in combination with the computing system is capable of performing a method for determining optimal radio transponder placement on an object, said method comprising:
exposing by an electromagnetic field generator, a layer of electromagnetic field absorbing material and an object to an electromagnetic field;
generating in response to said exposing, areas of thermal differences within said layer of electromagnetic field absorbing material; and
detecting by an infrared camera, said areas of thermal differences.

The present invention advantageously provides an efficient means for selecting a suitable area for placement of a communication device on a product.

BEST MODE FOR CARRYING OUT THE INVENTION

Figure 1:
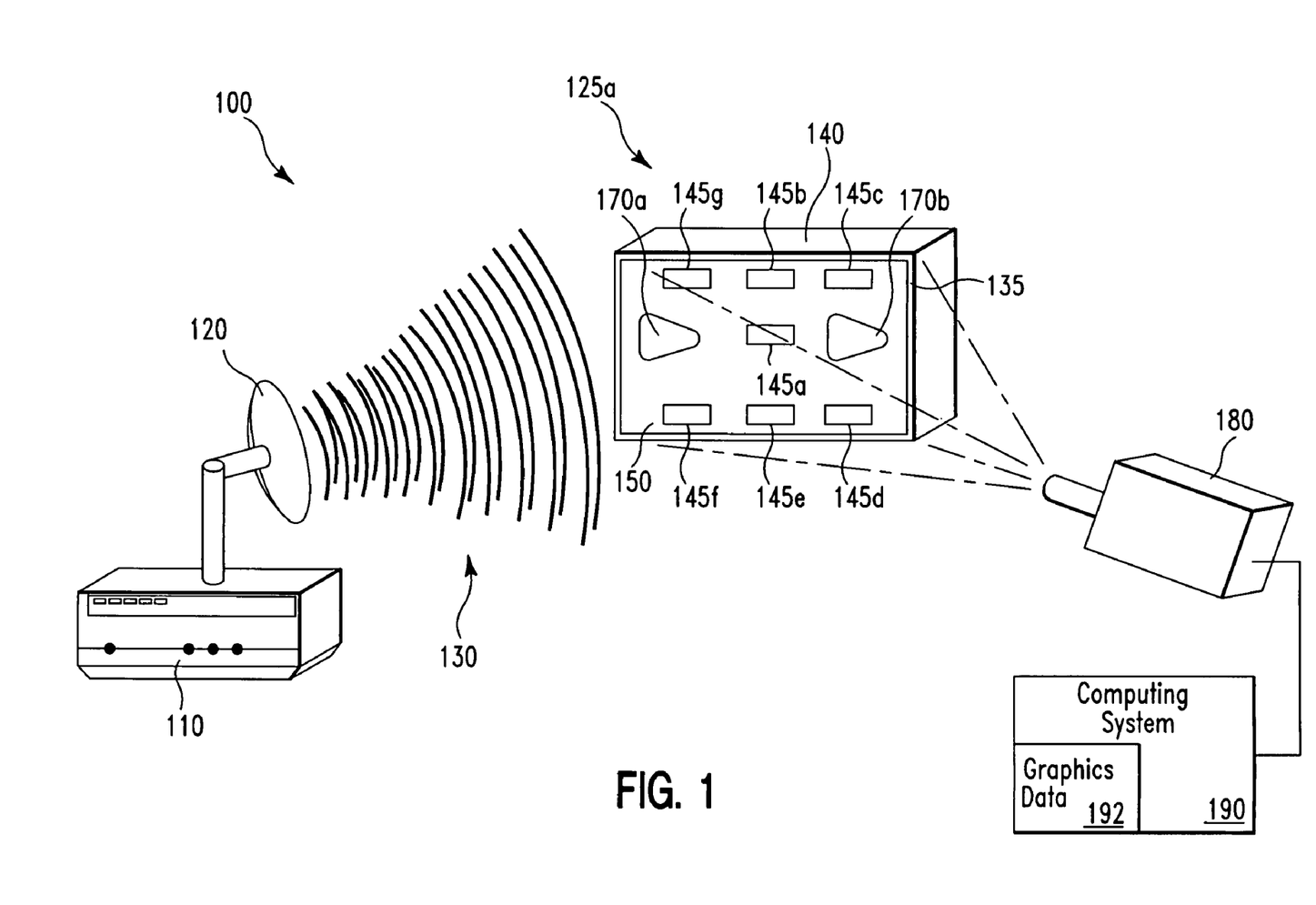
FIG. 1 illustrates a block diagram of a system for determining an optimal location for placement of a radio transponder on a surface of an object for tracking, in accordance with embodiments of the present invention.

FIG. 1 illustrates a block diagram of a system 100 for determining an optimal location for placement of a radio transponder on a surface 135 of an object 140 for tracking, in accordance with embodiments of the present invention. Object 140 may comprise any type of object including, inter alia, a package(s) comprising a product(s), a pallet for carrying a package(s) comprising products, etc. A radio transponder (e.g., a radio frequency identification (RFID) tag) is defined herein as a wireless device for receiving and responding (e.g., responding with an ID code) to radio frequency (RF) queries. The queries are transmitted from a radio transceiver (e.g., an RFID transceiver). The radio transponder in combination with the radio transceiver may be used to identify and/or track items (e.g., object 140) by placing the radio transponder on the item (e.g., object 140) and using the radio transceiver to query the radio transponder. In response to the queries, the radio transponder transmits data to the radio transceiver. Placing radio transponders (e.g., a radio frequency identification (RFID) tag) on packages and/or pallets (e.g., object 140) within a supply chain enables an entity (e.g., a company) to identify and/or track the packages and/or pallets throughout the supply chain. The tracking process allows the entity to maintain inventory control of the packages and/or pallets throughout the supply chain. For example, a package(s) may be tracked from a vendor to a warehouse, and ultimately to a retail store.

Determining an optimal location for placement of a radio transponder on surface 135 of object 140 so that the radio transceiver may communicate effectively with the radio transponder may be difficult because not all locations on surface 135 of object 140 are equivalent for radio transponder reception. For example, a tangential electrical component of an electromagnetic field (i.e., used for communications between a radio transponder and a radio transceiver) may be reduced at a surface of a conductor. For example, if a radio transponder is placed on surface 135 of object 140 in an area where a metal can (i.e., a product within object 140) touches the inside surface of object 140, the radio transponder may not be readable due to the conductive properties of the metal can. Additionally, an optimal location for placement of a radio transponder on surface 135 of object 140 may be determined by factoring in geometric constraints such as, inter alia, a proximity to graphics on surface 135 of object 140 (e.g., company logos, bar codes, etc). For example, an entity might not want a radio transponder placed over a company logo or a bar code. System 100 is used to generate a map for determining an optimal location for placement of a radio transponder on a surface 135 of object 140 so that a radio transceiver may communicate effectively with the radio transponder without interfering with any geometric constraints.

System 100 comprises an electromagnetic field generator 110 (e.g., a radio transmitter), a mapping package 125a, and an infrared camera 180 attached to a computing system 190. Infrared camera may comprise, inter alia, a still camera, a motion picture video camera, etc. Mapping package 125a comprises object 140 and a layer of electromagnetic absorbing material 150 placed on or over surface 135 of object 140. Electromagnetic absorbing material 150 may be adhesively attached to surface 135 of object 140. Electromagnetic absorbing material 150 may comprise any electromagnetic absorbing material known to a person of ordinary skill in the art including, inter alia, acrylonitrile butadiene styrene (ABS) plastic. Electromagnetic field 130 may comprise UHF radio waves comprising a frequency in a range of about 800 MHz to about 1000 MHz (e.g., 915 MHz in the US and North America, 869 MHz in Europe, 960 MHz in Japan, etc). A geometry and configuration of antenna 120 should mimic actual configuration used by a typical radio transceiver so that representative field patterns (i.e., for a radio transponder to be located on surface 135 of object 140) will be established. A required radiated power for electromagnetic field generator 110 is dependent upon radiative efficiency of antenna 120 and an absorption rate of electromagnetic absorbing material 150. Increasing the rate of absorption of energy by electromagnetic absorbing material 150 will reduce the power requirements of electromagnetic field generator 110, but will result in a perturbation of electromagnetic field 130.

A process for determining an optimal location for placement of a radio transponder on surface 135 of object 140 comprises enabling electromagnetic field generator 110 to generate an electromagnetic field 130 in a continuous or pulsed manner (at a specified frequency associated with a frequency of transmission for the radio transponder to be placed on surface 135 of object 140) and exposing layer of electromagnetic absorbing material 150 and object 140 to electromagnetic field 130. Layer of electromagnetic absorbing material 150 absorbs electromagnetic field 130 generated by electromagnetic field generator 110 and in response, areas 170a and 170b and areas 145a ... 145g of thermal differences are generated within electromagnetic absorbing material 150. Areas 170a and 170b and areas 145a ... 145g are associated with areas (e.g., see areas 215a and 215b in FIG. 3) of electromagnetic field strength (i.e., electromagnetic field intensity) at surface 135 of object 140. Areas 170a and 170b and areas 145a ... 145g generated within electromagnetic absorbing material 150 are determined by a balance between a thermal energy produced by absorption of electromagnetic field 130 and heat dissipation mechanisms. These heat dissipation mechanisms may include radiative, conductive, and convective losses. In order to minimize unwanted heat dissipation (losses), a thermally insulating layer (not shown) may be placed between layer of electromagnetic absorbing material 150 and surface 135 of object 140. The thermally insulating layer may comprise any material that is both thermally and electrically insulating. A dielectric constant thermally insulating layer may be about equal to dielectric constant of air. Alternatively, spacers (not shown) may perform a same function of a thermally insulating layer. Areas 170a and 170b represent highest thermal readings (i.e., highest temperatures) and are associated with areas comprising highest amounts (i.e., peaks) of electromagnetic field strength at surface 135 (e.g., see areas 215a and 215b in FIG. 3) and therefore areas (e.g., see areas 215a and 215b in FIG. 3) located on surface 135 of object 140 directly behind each of areas 170a and 170b are candidates for an optimal location for placement of a radio transponder on surface 135 of object 140. Areas 215a and 215b in FIG. 3 comprising highest amounts (i.e., peaks) of electromagnetic field strength at surface 135 of object 140 are optimal locations for placement of a radio transponder on surface 135 because radio transponder reception (i.e., used for communications between the radio transponder and a radio transceiver) is greatest at areas comprising peaks (i.e., highest amounts) of electromagnetic field strength. Areas 170a and 170b represent lowest thermal readings (i.e., lowest temperatures) and are associated with lowest amounts (i.e., valleys) of electromagnetic field strength at surface 135 and therefore any areas located on surface 135 of object 140 directly behind each of areas 145a ... 145b are not candidates for an optimal location for placement of a radio transponder on surface 135 of object 140. Areas 170a and 170b and areas 145a ... 145g are detected and captured (e.g., as a digital image) by infrared camera 180 attached to computing system 190. Computing system 190 generates a thermal map (e.g., comprising a grayscale image) illustrating areas 170a and 170b and areas 145a ... 145g. The thermal map comprising areas 170a and 170b and areas 145a ... 145g may comprise specified brightness levels with respect to electromagnetic field strength at surface 135. For example, areas 170a and 170b may comprise a higher brightness level than areas 145a ... 145g to illustrate a higher electromagnetic field strength at surface 135. Computing system 190 may comprise graphics data 192 related to object 140. For example, graphics data 192 may comprise data related to graphics on surface 135 of object 140 (e.g., graphics constraints such as, inter alia, company logos, bar codes, etc) that should not be obstructed by placement of a radio transponder. The thermal map (i.e., comprising images) illustrating areas 170a and 170b and areas 145a . . . 145g in combination with graphics data 192 is used to determine an optimal location for placement of a radio transponder on surface 135 of object 140. For example, the thermal map generated by computing system 190 illustrates that areas 170a and 170b comprise the highest thermal readings (i.e., temperature) indicating that areas 170a and 170b are associated with highest amounts (i.e., peaks) of electromagnetic field strength at surface 135 and therefore it is determined that areas (e.g., see areas 215a and 215b in FIG. 3) located on surface 135 of object 140 directly behind each of areas 170a and 170b may be optimal locations for placement of a radio transponder on surface 135. Graphics data 192 is applied to the thermal map by computing system 190.

Graphics data 192 (i.e., in this example) specifies that an area (e.g., see area 215a in FIG. 3) located on surface 135 of object 140 directly behind area 170a comprises a geometrical constraint (e.g., a company logo is located behind area 170a). Therefore, computing system 190 determines that the area (e.g., area 215a in FIG. 3) located behind area 170a is not an optimal location for placement of a radio transponder (i.e., due to a geometrical constraint) and the area (e.g., area 215b in FIG. 3) located behind area 170b comprising a highest thermal reading (i.e., temperature) without any geometrical constraints is determined to be an optimal location for placement of a radio transponder.

Additionally, the above described process may be used for determining optimal locations for placement of a plurality of radio transponders on a plurality of objects (e.g., object 140) stacked on a pallet or other means of aggregation. For example, some materials (e.g., products) contained within objects (e.g., packages) are relatively transparent to electromagnetic field 130 (e.g. products such as paper goods) thereby making it possible to read radio transponders (e.g., RFID tags) on objects that are located behind others on the pallet. Therefore, by using results from the process for determining an optimal location for placement of a radio transponder as described, supra, a plan for optimal orientation and stacking of multiple objects on a pallet may be devised based on types of materials (e.g., products) contained within objects. A plurality of objects may be stacked using machines called automatic palletizers which may be programmed using the information gathered during individual object testing. Pallet maps may additionally be prepared using the results of testing of configurations of multiple numbers of objects. These pallet maps may additionally be used for manual stacking of objects on a pallet. Therefore it may be possible to read radio transponders on objects located interior to the stacking arrangement as well as radio transponders located on the outside of the stacked objects.

Figure 2:
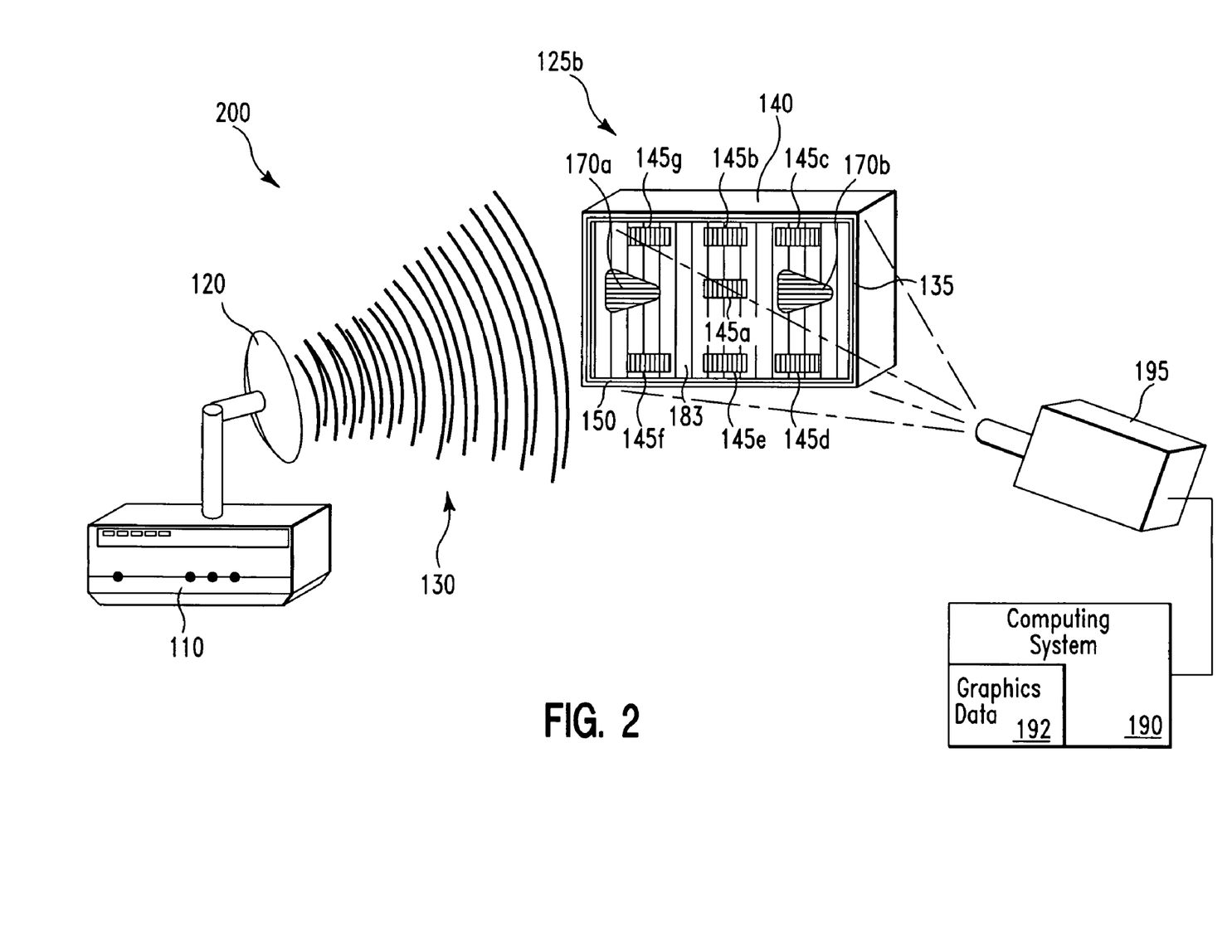
FIG. 2 illustrates an alternative to the system of FIG. 1, in accordance with embodiments of the present invention.

FIG. 2 is an alternative to the system 100 of FIG. 1 illustrating a block diagram of a system 200 for determining an optimal location for placement of a radio transponder on a surface 135 of an object 140 for tracking, in accordance with embodiments of the present invention. In contrast to FIG. 1, the system of FIG. 2 comprises a mapping package 125b comprising all elements of mapping package 125a of FIG. 1 with an additional layer of thermal indicating material 183 and a standard camera 195. Layer of thermal indicating material 183 may comprise any type of thermal indicating material known to a person of ordinary skill in the art including, inter alia, a thermo chromic thermal indicating material (e.g., a thin liquid crystal layer), a temperature indicating paper, etc. Layer of electromagnetic field absorbing material 150, layer of thermal indicating material 183, and object 140 are exposed to electromagnetic field 130 and in response, areas 170a and 170b and areas 145a . . . 145g of thermal differences are generated within electromagnetic field absorbing material 150. Layer of thermal indicating material 183 detects and illustrates areas 170a and 170b and areas 145a . . . 145g of thermal differences generated within electromagnetic field absorbing material 150.

As a first example for detection of areas 170a and 170b and areas 145a . . . 145g, layer of thermal indicating material 183 comprises a thin liquid crystal layer. As areas 170a and 170b and areas 145a . . . 145g of thermal differences are generated, associated color variations (i.e., temporary color changes represented by different shading) are generated within the thin liquid crystal layer. The associated color variations in the thin crystal layer indicate thermal readings (i.e., generates a thermal map) and associated peaks and valleys of electromagnetic field strength at surface 135 of object 140. For example, a high thermal reading indicating a peak in electromagnetic field strength may be represented by blue in the thin crystal layer and a low thermal reading indicating a valley in electromagnetic field strength may be represented by red in the thin crystal layer. A thin crystal layer utilizes a selective color scattering of chiral nematic liquid crystals (LC) resulting from the temperature dependence of the chiral pitch. In a chiral nematic liquid crystal, the pitch is a decreasing function of the temperature. LCs are also referred to as thermo chromic. Therefore, by using chiral nematics having the pitch of the order of the wavelength of visible light in a temperature range of interest, small or large variations of temperature are shown up as changes in the color of the scattered light. The materials show a continuous color corresponding to a continuous temperature variation in both heating and cooling cycles. Chiral nematics with material properties for which the color changes from red to blue in a temperature range of 0.1 C up to 100 C are available. This may be achieved by preparing suitable chiral nematics as a single component or eutectic mixtures. The chiral nematics permit immediate, reproducible visualization of the temperature distribution in colors. Optimal locations for placement of a radio transponder on surface 135 of object 140 may be selected to correspond to the highest thermal reading. The color variations in the thin crystal layer indicating thermal readings and associated peaks and valleys of electromagnetic field strength at surface 135 of object 140 may be recorded photographically by camera 195 and transferred to computing system 190 for analysis. The color variations in the thin crystal layer indicating thermal readings and associated peaks and valleys of electromagnetic field strength at surface 135 of object 140 may be recorded photographically by camera 195 either for static observation of thermal mapping or dynamic observation of rapid temperature changes.

As a second example for detection of areas 170a and 170b and areas 145a . . . 145g, layer of thermal indicating material 183 comprises a material capable of illustrating thermal differences as a permanent change of a physical property of the material. For example, a permanent change of a physical property of the material may include, inter alia, a coagulation of a protein layer within the materiel, a color change of the material. Thermal indicating material 183 may comprise, inter alia, a temperature indicating paper that is commonly used in some types of printers. The temperature indicating paper may be manufactured by Sensor Product Inc. of East Hanover, N.J. The irreversible changes illustrating thermal differences may be used to generate the thermal map associated with peaks and valleys of electromagnetic field strength at surface 135 of object 140. The physical property of the material indicating thermal readings and associated peaks and valleys of electromagnetic field strength at surface 135 of object 140 may be recorded photographically by camera 195 and transferred to computing system 190 for analysis.

Figure 3:
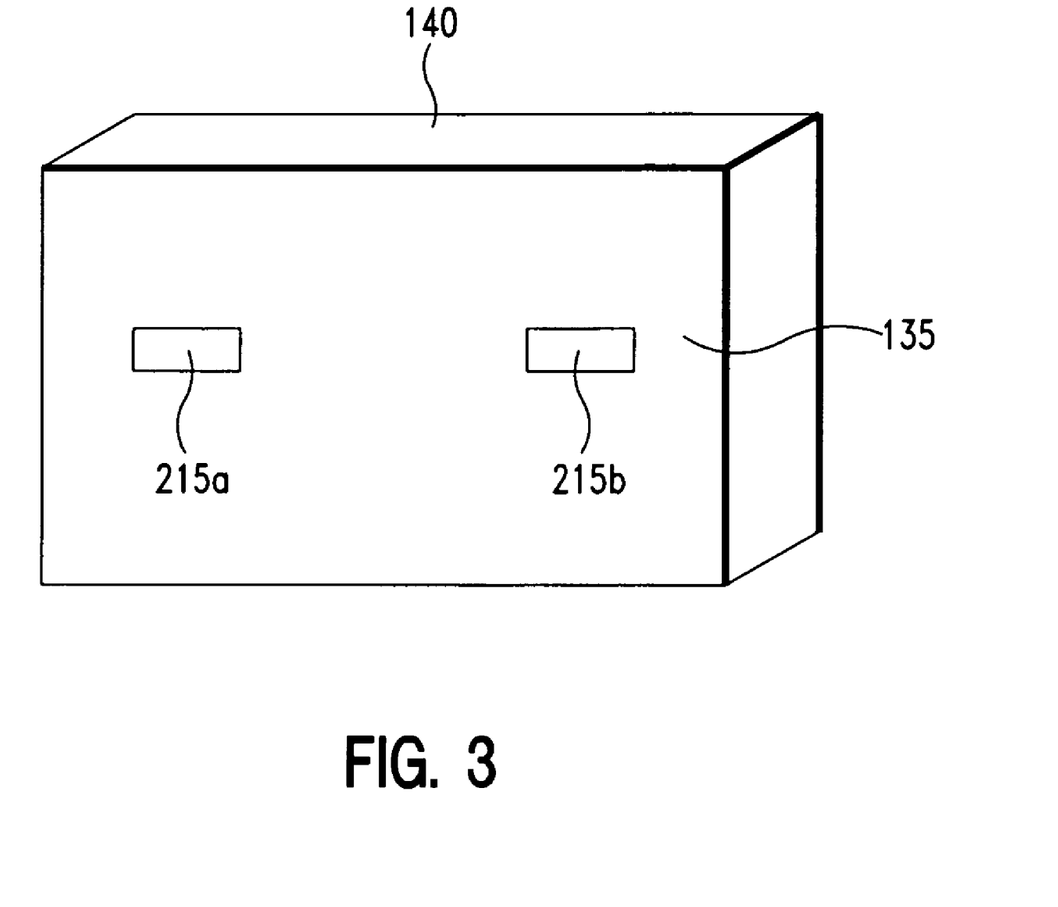
FIG. 3 illustrates optimal locations for placement of a radio transponder on an object, in accordance with embodiments of the present invention.

FIG. 3 illustrates optimal locations for placement of a radio transponder on surface 135 of object 140 determined in FIGS. 1 and 2, in accordance with embodiments of the present invention. Optimal locations for placement of a radio transponder on surface 135 of object 140 are represented by areas 215a and 215b. Areas 215a and 215b are located directly behind areas 170a and 170b from FIGS. 1 and 2.

Figure 4:
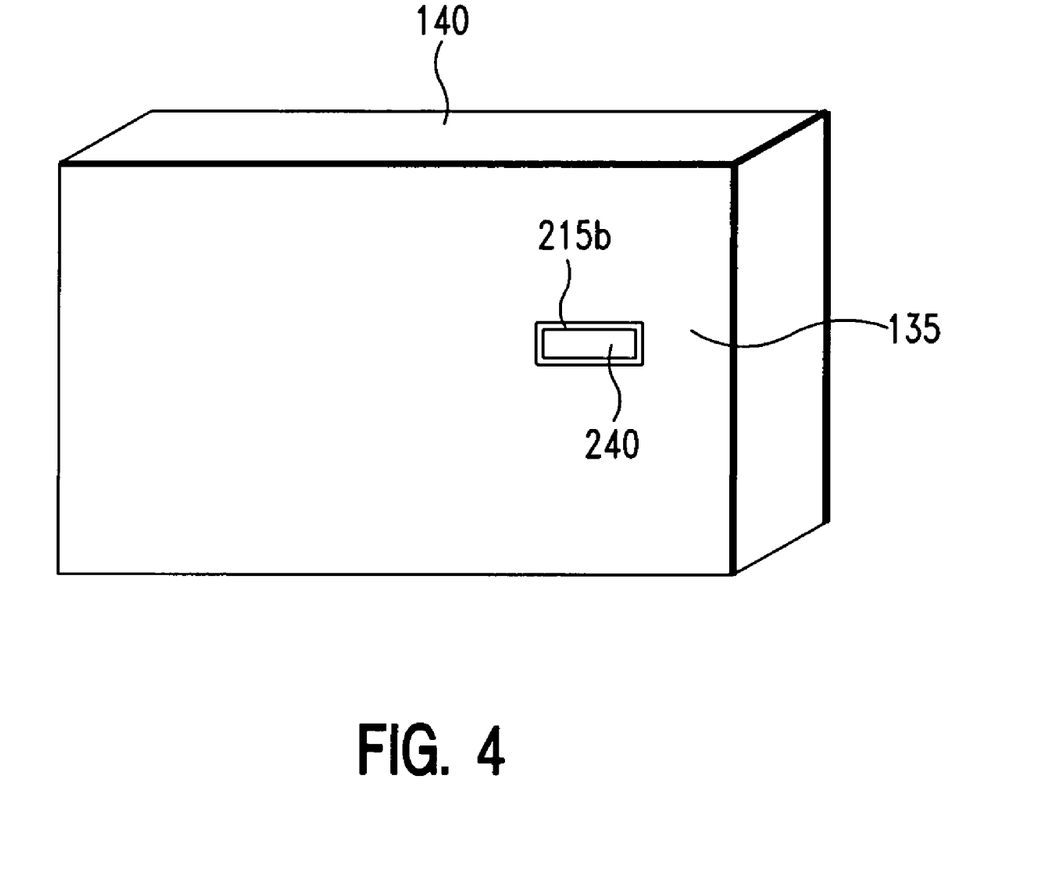
FIG. 4 illustrates placement of a radio transponder on an object, in accordance with embodiments of the present invention.

FIG. 4 illustrates placement of a radio transponder 240 on surface 135 of object 140, in accordance with embodiments of the present invention. Radio transponder 240 is placed within area 215b that has been determined to be an optimal location during a process as described with respect to FIGS. 1-3.

Figure 5:
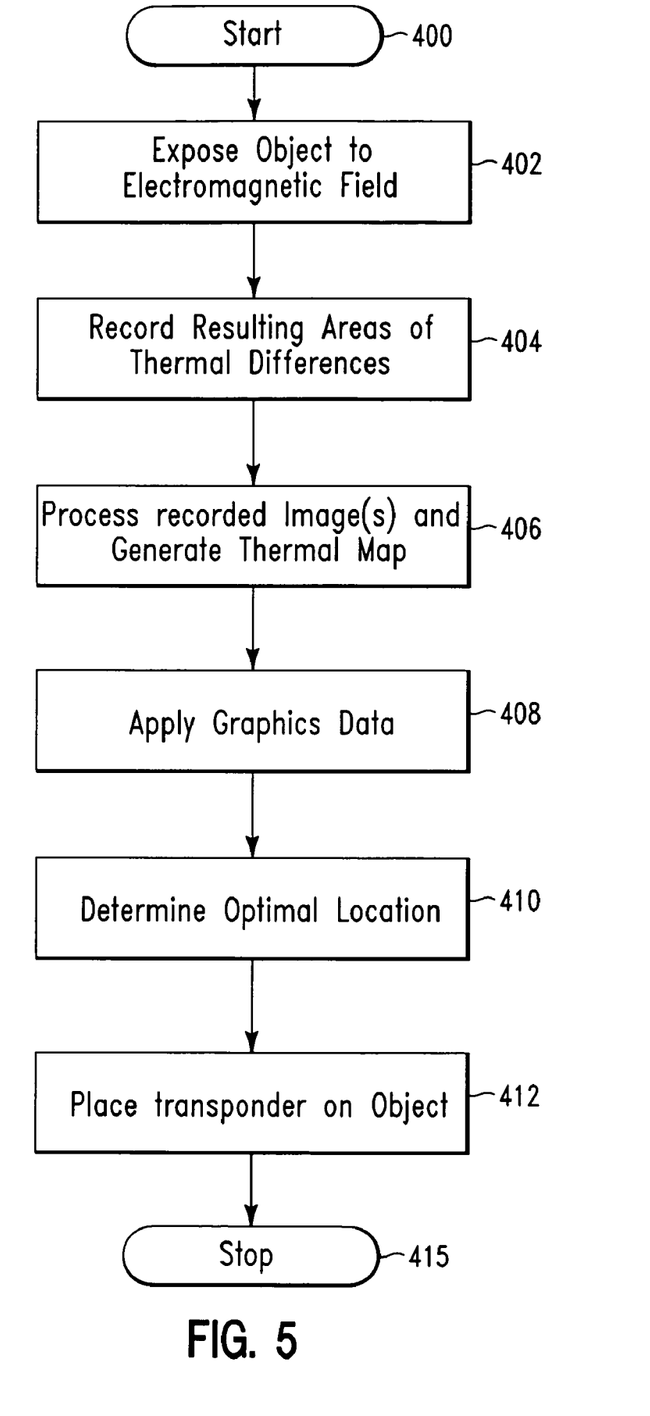
FIG. 5 illustrates a flowchart describing an algorithm for determining an optimal location for placement of a radio transponder on a surface of an object, in accordance with embodiments of the present invention.

FIG. 5 illustrates a flowchart describing an algorithm for determining an optimal location for placement of a radio transponder on a surface 135 of an object 140 in FIGS. 1-4, in accordance with embodiments of the present invention. In step 400, the process is initiated. In step 402, layer of electromagnetic field absorbing material 150, layer of thermal indicating material 183 (as described with respect to FIG. 2), and object 140 are exposed to electromagnetic field 130 and in response, areas 170a and 170b and areas 145a . . . 145g of thermal differences are generated within electromagnetic field absorbing material 150. In step 404, images of areas 170a and 170b and areas 145a . . . 145g of thermal differences are captured and recorded (e.g., as a digital image) by infrared camera 180 (see FIG. 1) or standard camera 195 (see FIG. 2) attached to computing system 190. In step 406, the images are processed by computing system 190 and a thermal map (e.g., comprising a grayscale image or a multicolor image) illustrating areas 170a and 170b and areas 145a . . . 145g is generated. The thermal map comprising images of areas 170a and 170b and areas 145a . . . 145g may comprise specified brightness levels or different colors with respect to electromagnetic field strength at surface 135. In step 408, graphics data 192 is applied to the thermal map as described, supra, with respect to FIG. 1. In step 410, an optimal location (e.g., see optimal location 215b in FIG. 4) is determined based on the thermal map and graphics data 192. In step 412, transponder 240 is placed in an optimal location (e.g., see optimal location 215b in FIG. 4) on surface 135 of object 140. In step 415, the process is terminated.

Thus the present invention discloses a process for deploying or integrating computing infrastructure, comprising integrating computer-readable code into computer system (e.g., computing system 190 in FIGS. 1 and 2), wherein the code in combination with the computing system is capable of performing a method for determining optimal radio transponder placement (e.g., see radio transponder 240 in FIG. 4) on an object (e.g., see object 140 in FIG. 1).

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A process for deploying computing infrastructure, said process comprising integrating computer-readable code into a computing system, wherein the code in combination with the computing system is capable of performing a method for determining optimal radio transponder placement on an object, said method comprising:

exposing by an electromagnetic field generator, a layer of electromagnetic field, absorbing material, a thermal insulating layer, and an object to an electromagnetic field, wherein said thermal insulating layer is located between said object and said electromagnetic field absorbing material, and wherein said layer of electromagnetic field absorbing material comprises Acrylonitrile Butadiene Styrene (ABS) plastic;

generating in response to said exposing, areas of thermal differences within said layer of electromagnetic field absorbing material;

detecting by an infrared camera, said areas of thermal differences, wherein said areas of thermal differences indicate corresponding areas of differential electromagnetic field strength on a first surface of said object, and wherein said computing system is connected to said infrared camera; and generating by said computing system, a thermal map illustrating each of said areas of thermal differences, wherein a first area of said areas of thermal differences comprising a highest temperature indicates a second area of electromagnetic field strength from said corresponding areas of differential electromagnetic field strength on said first surface comprising a highest electromagnetic field strength, wherein said computing system comprises a memory structure comprising graphics data, wherein said graphics data comprises graphics constraints associated with graphics located on said first surface, wherein said graphics are selected from the group consisting of a company logo and a bar code, wherein said graphics data indicates that said second area does not comprise any graphics constraints, and wherein said second area comprises an optimal location for placing a radio transponder for tracking said object.

2. A mapping system, comprising:

an electromagnetic field generator;

a thermal insulating layer over an object, wherein said thermal insulating layer comprises a thermal and electrical insulating material;

a layer of electromagnetic field absorbing material over said thermal insulating layer, wherein said electromagnetic field generator generates an electromagnetic field and exposes said electromagnetic field absorbing material and said object to said electromagnetic field, wherein said layer of electromagnetic field absorbing material absorbs said electromagnetic field and generates areas of thermal differences within said electromagnetic field absorbing material, and wherein said layer of electromagnetic field absorbing material comprises Acrylonitrile Butadiene Styrene (ABS) plastic;

an infrared camera for detecting said areas of thermal differences, wherein said areas of thermal differences indicate corresponding areas of differential electromagnetic field strength on a first surface of said object; and a computing system connected to said infrared camera, wherein said computing system generates a thermal map illustrating each of said areas of thermal differences, wherein a first area of said areas of thermal differences comprising a highest temperature indicates a second area of electromagnetic field strength from said corresponding areas of differential electromagnetic field strength of said first surface comprising a highest electromagnetic field strength, wherein said computing system comprises a memory structure comprising graphics data, wherein said graphics data comprises graphics constraints associated with graphics locates on said first surface, wherein said graphics are selected from the group consisting of a company logo and a bar code, wherein said graphics data indicates that said second area does not comprise any graphics constraints, and wherein said second area comprises an optimal location for placing a radio transponder for tracking said object.

3. The mapping system of claim 2, wherein said layer of electromagnetic field absorbing material is located between said thermal insulating layer and said eletromagnetic field.

4. The mapping system of claim 1, wherein said object is selected from the group consisting of a package comprising at least one product and a pallet for carrying at least one package comprising at least one product.

5. The mapping system of claim 1, wherein said second area comprises an optimal location for placing a radio transponder for tracking said object.

6. The mapping system of claim 2, wherein said radio transponder is an RFID tag.

7. A mapping system, comprising:
an electromagnetic field generator;
a layer of electromagnetic field absorbing material over an object, wherein said layer of electromagnetic field absorbing material comprises Acrylonitrile Butadiene Styrene (ABS) plastic;
a layer of thermal indicating material over said layer of electromagnetic field absorbing material, wherein said electromagnetic field generator generates an electromagnetic field and exposes said layer of thermal indicating material, said layer of electromagnetic field absorbing material, and said object to said electromagnetic field, wherein said layer of electromagnetic field absorbing material absorbs said electromagnetic field and generates areas of thermal differences within said electromagnetic field absorbing material, wherein said layer of thermal indicating material generates a thermal map illustrating each of said areas of thermal differences, and wherein said areas of thermal differences indicate corresponding areas of differential electromagnetic field strength on a first surface of said object;
a camera recording said thermal map, and
a computing system connected to said camera, wherein said computing system illustrates said thermal map for analysis, wherein a first area of said areas of thermal differences comprising a highest temperature is associated with a second area of electromagnetic field strength from corresponding areas of differential electromagnetic field strength on said first surface comprising a highest electromagnetic field strength, wherein said computing system comprises a memory structure comprising graphics data, wherein said graphics data comprises graphics constraints associated with graphics located on said first surface, wherein said graphics are selected from the group consisting of a company logo and a bar code, wherein said graphics data indicates that said second area does not comprise any graphics constraints, and wherein said second area comprises an optimal location for placing a radio transponder for tracking said object.

8. The mapping system of claim 7, wherein said layer of thermal indicating material is located between said layer of electromagnetic field absorbing material and said electromagnetic field generator, and wherein said layer of electromagnetic field absorbing material is located between a first surface of said object and said layer of thermal indicating material.

9. The mapping system of claim 7, wherein said layer of thermal indicating material comprises a thermo chromic thermal indicating material.

10. The mapping system of claim 7, wherein said layer of thermal indicating material comprises a temperature indicating paper.

11. The mapping system of claim 7, wherein said object is selected from the group consisting of a package comprising at least one product and a pallet for carrying at least one package comprising at least one product.

12. The mapping system of claim 7, wherein said second area comprises an optimal location for placing a radio transponder for tracking said object.

13. The mapping system of claim 11, wherein said radio transponder is an RFID tag.

14. A mapping method, comprising:
providing an electromagnetic field generator, a layer of electromagnetic field absorbing material, a thermal insulating layer over an object, and an infrared camera, wherein aid thermal insulating layer comprises a thermal and electrical insulating material, and wherein said layer of electromagnetic field absorbing material comprises Acrylonitrile Butadiene Styrene (ABS) plastic;
exposing by said electromagnetic field generator, said layer of electromagnetic field absorbing material and said object to said electromagnetic field;
generating in response to said exposing, areas of thermal differences within said layer of electromagnetic field absorbing material;
detecting by said infrared camera, said areas of thermal differences, wherein said areas of thermal differences indicate corresponding areas of differential electromagnetic field strength on a first surface of said object;
providing a computing system connected to said infrared camera; and
generating by said computing system, a thermal map illustrating each of said areas of thermal differences, wherein a first area of said areas of thermal differences comprising a highest temperature indicates a second area of electromagnetic field strength from said corresponding areas of differential electromagnetic field strength on said first surface comprising a highest electromagnetic field strength, wherein said computing system comprises a memory structure comprising graphics data, wherein said graphics data comprises graphics constraints associated with graphics located on said first surface, wherein said graphics are selected from the group consisting of a company logo and a bar code, wherein said graphics data indicates that said second area does not comprise any graphics constraints, and wherein said second area comprises an optimal location for placing a radio transponder for tracking said object.

15. The method of claim 14, wherein said layer of electromagnetic field absorbing material is located between said thermal insulating layer and said electromagnetic field generator.

16. The mapping system of claim 14, wherein said object is selected from the group consisting of a package comprising at least one product and a pallet for carrying at least one package comprising at least one product.

17. The method of claim 14, wherein said second area comprises an optimal location for placing a radio transponder for tracking said object.

18. The method of claim 17, wherein said radio transponder is an RFID tag.

19. A mapping method, comprising:
providing an electromagnetic field generator, a layer of electromagnetic field absorbing material over an object, and an infrared camera, wherein said layer of electromagnetic field absorbing material comprises Acrylonitrile Butadiene styrene (ABS) plastic;
exposing by said electromagnetic field generator, said layer of electromagnetic field absorbing material and said object to said electromagnetic field;
generating in response to said exposing, areas of thermal differences within said layer of electromagnetic field absorbing material;
generating in response to said exposing, areas of thermal differences within said layer of electromagnetic field absorbing material;
generating by said of layer of thermal indicating material, a thermal map illustrating each of said areas of thermal differences, wherein said areas of thermal differences indicate corresponding areas of differential electromagnetic field strength on a first surface of said object;
recording by said camera, said thermal map;
providing a computing system connected to said camera;
illustrating by said computing system, said thermal map; and
associating a first area of said areas of thermal differences comprising a highest temperature with a second area of electromagnetic field strength from said corresponding areas of differential electromagnetic field strength on said first surface comprising a highest electromagnetic field strength, wherein said computing system comprises a memory structure comprising graphics data, wherein said graphics data comprises graphics constraints associated with graphics located on aid first surface, wherein said graphics are selected from the group consisting of a company logo and a bar code, wherein said graphics data indicates that said second area does not comprise any graphics constraints, and wherein said second area comprises an optimal location for placing a radio transponder for tracking said object.

20. The mapping method of claim 19, wherein said layer of electromagnetic field absorbing material is located over a first surface of said object, and wherein said layer of thermal indicating material is located between said layer of electromagnetic field absorbing material and said electromagnetic field generator.

21. The mapping method of claim 19, wherein said layer of thermal indicating material comprises a thermo chromic thermal indicating material.

22. The mapping method of claim 19, wherein said layer of thermal indicating material comprises a temperature indicating paper.

23. The mapping method of claim 19, layer of thermal indicating material comprises a layer of thin crystal material.

24. The method of claim 19, wherein said object is selected from the group consisting of a package comprising at least one product and a pallet for carrying at least one package comprising at least one product.

25. The mapping of claim 19, wherein said second area comprises an optimal location for placing a radio transponder for tracking said object.

26. The mapping method of claim 25, wherein said radio transponder is an RFID tag.

* * * * *